(12) United States Patent
Ma et al.

(10) Patent No.: US 7,683,459 B2
(45) Date of Patent: Mar. 23, 2010

(54) BONDING METHOD FOR THROUGH-SILICON-VIA BASED 3D WAFER STACKING

(75) Inventors: Wei Ma, New Territories (HK); Xunqing Shu, New Territories (HK); Chang Hwa Chung, New Territories (HK)

(73) Assignee: Hong Kong Applied Science and Technology Research Institute Company, Ltd., Shatin, New Territories, Hong Kong (CN)

( * ) Notice: Subject to any disclaimer, the term of this patent is extended or adjusted under 35 U.S.C. 154(b) by 54 days.

(21) Appl. No.: 12/131,788

(22) Filed: Jun. 2, 2008

(65) Prior Publication Data
US 2009/0294916 A1 Dec. 3, 2009

(51) Int. Cl.
*H01L 29/40* (2006.01)
*H01L 21/00* (2006.01)

(52) U.S. Cl. ............ 257/621; 257/777; 257/E23.174; 257/E21.509; 438/107; 438/118; 438/667

(58) Field of Classification Search ............ 257/621, 257/686, 777, E25.013, E23.011, E21.509, 257/E23.174; 438/107, 109, 118, 667
See application file for complete search history.

(56) References Cited

U.S. PATENT DOCUMENTS

| | | | |
|---|---|---|---|
| 4,897,708 A | 1/1990 | Clements | |
| 4,954,875 A | 9/1990 | Clements | |
| 5,952,725 A * | 9/1999 | Ball | ............ 257/777 |
| 6,448,661 B1 | 9/2002 | Kim et al. | |
| 6,577,013 B1 | 6/2003 | Glenn et al. | |
| 6,593,645 B2 | 7/2003 | Shih et al. | |
| 6,933,172 B2 | 8/2005 | Tomimatsu | |
| 7,157,787 B2 | 1/2007 | Kim et al. | |
| 7,215,033 B2 | 5/2007 | Lee et al. | |
| 7,317,256 B2 | 1/2008 | Williams et al. | |
| 7,446,420 B1 * | 11/2008 | Kim | ............ 257/777 |
| 2001/0006257 A1 | 7/2001 | Shih et al. | |
| 2002/0109236 A1 | 8/2002 | Kim et al. | |
| 2006/0049501 A1 | 3/2006 | Lee et al. | |
| 2006/0050486 A1 | 3/2006 | Lee et al. | |
| 2006/0273455 A1 | 12/2006 | Williams et al. | |
| 2007/0222050 A1 | 9/2007 | Lee et al. | |
| 2008/0029850 A1 * | 2/2008 | Hedler et al. | ............ 257/621 |
| 2008/0079121 A1 | 4/2008 | Han | |

FOREIGN PATENT DOCUMENTS

CN 101038908 A 9/2007

OTHER PUBLICATIONS

PCT/CN2008/071193; filed Jun. 5, 2008; Search Report mailed Nov. 20, 2008; 4 pp.
PCT/CN2008/071193; filed Jun. 5, 2008; Written Opinion mailed Nov. 20, 2008; 6 pp.

* cited by examiner

*Primary Examiner*—Tuan N. Quach
(74) *Attorney, Agent, or Firm*—Wells St. John, P.S.

(57) ABSTRACT

There is described a hybrid bonding method for through-silicon-via based wafer stacking. Patterned adhesive layers are provided to join together adjacent wafers in the stack, while solder bonding is used to electrically connect the vias. The adhesive layers are patterned to enable outgassing and to provide stress relief.

15 Claims, 6 Drawing Sheets

BONDING METHOD FOR THROUGH-SILICON-VIA BASED 3D WAFER STACKING

FIELD OF THE INVENTION

This invention relates to a bonding method for through-silicon-via based 3D wafer stacking, in particular the invention relates to a hybrid bonding method employing aspects of both adhesive and solder bonding. The invention also extends to the resulting wafer stack assembly.

BACKGROUND OF THE INVENTION

With electronic devices, particularly portable devices such as mobile phones, becoming smaller and yet at the same time offering a wider range of functions, there is a need to integrate multifunctional chips but without increasing the size of the devices and keeping a small form factor. Increasing the number of electronic components in a 2D structure is incompatible with these objectives, and therefore 3D packages are increasingly being adopted in order to provide greater functionality and higher component density but with a small form factor.

In a 3D structure electronic components such as semiconductor chips with different active IC devices may be provided in a multilayer stacked structure. Traditionally wire bonding (e.g., U.S. Pat. No. 6,933,172) is used to establish electrical interconnects between chips, but wire bonding requires greater in-plane size and out-of-plane size and is inconsistent with the objective of maximizing the component density. To connect electrically the components in different layers through-silicon-via (TSV) technology may be used to provide the electrical interconnect and to provide mechanical support. In TSV technology a via is fabricated in a silicon chip with different active IC devices or other devices fabricated by a semiconductor process and the via is filled with metal such as Cu, Au, W, solders, or a highly-doped semiconductor material such as polysilicon. Multiple components provided with such vias are then stacked and bonded together.

PRIOR ART

The bonding method is an important aspect of the fabrication of stacked electronic components. An ideal bonding method should be reliable and cost-effective. As an alternative to wire bonding interconnection, the use of TSV interconnects has been proposed and methods including diffusion bonding, soldering, and adhesive bonding can be used to bond wafers/chips with TSV interconnects.

In diffusion bonding a thin metal bonding layer (formed for example preferably from copper but also possibly tin, indium, gold, nickel, silver, palladium, palladium-nickel alloy or titanium) is applied to the respective surface of semiconductor components that are to be bonded. When the components are brought together under the correct conditions of temperature and pressure the two metal bonding layers diffuse into each other to form an intermetallic compound (IMC) and create the bond. Diffusion bonding produces a good quality bond that is reliable, but disadvantages of this method include the requirements for very good coplanarity of the two semiconductor components and the need for a high bonding temperature. The method is therefore difficult to implement and is expensive. A typical example of a diffusion bonding method is shown in U.S. Pat. No. 7,157,787.

Adhesive bonding is a low cost option in which an adhesive layer is provided on the surfaces to be bonded together. An example of adhesive bonding is shown in U.S. Pat. No. 6,593,645. U.S. Pat. No. 6,448,661 shows an example of the prior art in which chips are bonded using conductive adhesives such as anisotropic conductive film (ACF) or anisotropic conductive adhesive (ACA). Another example of adhesive bonding is shown in U.S. Pat. No. 4,897,708 where wafers are bonded by adhesive and electrical connections are made by a conductive liquid. However, while adhesive bonding is low cost and does not present significant manufacturing problems, it provides inferior electrical connections at the vias and is not generally suitable for high current use and is unreliable.

An example of a soldering method is shown in U.S. Pat. No. 6,577,013. In a soldering method solder is applied at the junctions of vias on semiconductor components to be stacked. Soldering does not require such high temperatures as diffusion bonding and can still produce a good reliable bond. However, soldering encounters problems as the number of components being stacked increases. An example of solder bonding can be found in U.S. Pat. No. 7,317,256 which describes the bonding of multiple stacked wafers, another example is U.S. Pat. No. 7,215,033. In such methods, however, when a new wafer is added to a stack and a soldering process is carried out to form an IMC connecting the new wafer to the stack, the previously formed IMCs between other wafers grow very fast under the high soldering temperature. Since the IMC is usually a hard and brittle material so as it grows failure issues will occur (e.g., in the drop qualification test). Furthermore, if the volume of the solder materials is not controlled well in the manufacturing process, in multiple solder bonding steps the remained solders, which are not formed IMCs, will be reflowed again, this will undermine their reliability and generate manufacturing defects, leading to potential failures in severe conditions.

SUMMARY OF THE INVENTION

According to the invention there is provided a method of forming a wafer stack comprising the steps of, forming a plurality of wafers into a stack, each said wafer being provided with at least one through-silicon-via and with solder material being provided between through-silicon-vias formed in adjacent wafers, said wafers being bonded together by means of adhesive layers provided between adjacent wafers, and subjecting said stack to a single reflow process whereby said through-silicon-vias are electrically interconnected by said solder material.

Preferably the adhesive layers are patterned to define channels that extend from at least some of said through-silicon-vias to an edge of the stack. For example the adhesive layer may comprise a photosensitive adhesive that is patterned by exposure to light.

In preferred embodiments of the invention the adhesive layer is patterned to define a space surrounding each through-silicon-via formed in a wafer. The space may be annular or any other suitable shape. In many cases at least two through-silicon-vias will be formed in a wafer and the spaces surrounding said through-silicon-vias are interconnected by channels. For example a wafer may be provided with a regular array of through-silicon-vias and the space surrounding each said through-silicon-via is connected by channels to the spaces surrounding all adjacent through-silicon-vias.

In a particularly preferred embodiment, the adhesive layers are patterned to divide a wafer into a plurality of chips and wherein the chips in a wafer are divided by main channels formed by patterning of the adhesive layer and extending to at least one edge of the wafer, and each chip may include at least one through-silicon-via provided with a channel extending from the space surrounding the through-silicon-via to a main channel.

Preferably the stack is subject to loading compression during said soldering process.

According to another aspect of the invention there is provided a wafer stack comprising a plurality of wafers arranged in a stack, each wafer including at least one through-silicon-via, wherein adjacent wafers are bonded together by means of an intervening adhesive layer, and wherein electrical connections between the wafers are formed by solder material provided between the through-silicon-vias formed in adjacent layers.

Preferably the adhesive layers are patterned to define channels that extend from at least some of said through-silicon-vias to an edge of the stack assembly. In particular the adhesive layers may be patterned to define a space surrounding each through-silicon-via formed in a wafer. This space may be annular or any other suitable shape.

In preferred embodiments at least two through-silicon-vias are formed in a wafer and the spaces surrounding said through-silicon-vias are interconnected by channels. For example a wafer may be provided with a regular array of through-silicon-vias wherein the space surrounding each said through-silicon-via is connected by channels to the spaces surrounding all adjacent through-silicon-vias.

In a particularly preferred embodiment said adhesive layers are patterned to divide each wafer into a plurality of chips and wherein said chips in a wafer are divided by main channels formed in a said adhesive layer and extending to at least one edge of the wafer, and wherein each said chip includes at least one through-silicon-via provided with a channel extending from the space surrounding said through-silicon-via to a said main channel.

BRIEF DESCRIPTION OF THE DRAWINGS

Some embodiments of the invention will now be described by way of example and with reference to the accompanying figures, in which.

DETAILED DESCRIPTION OF PREFERRED EMBODIMENTS

Figure 1:
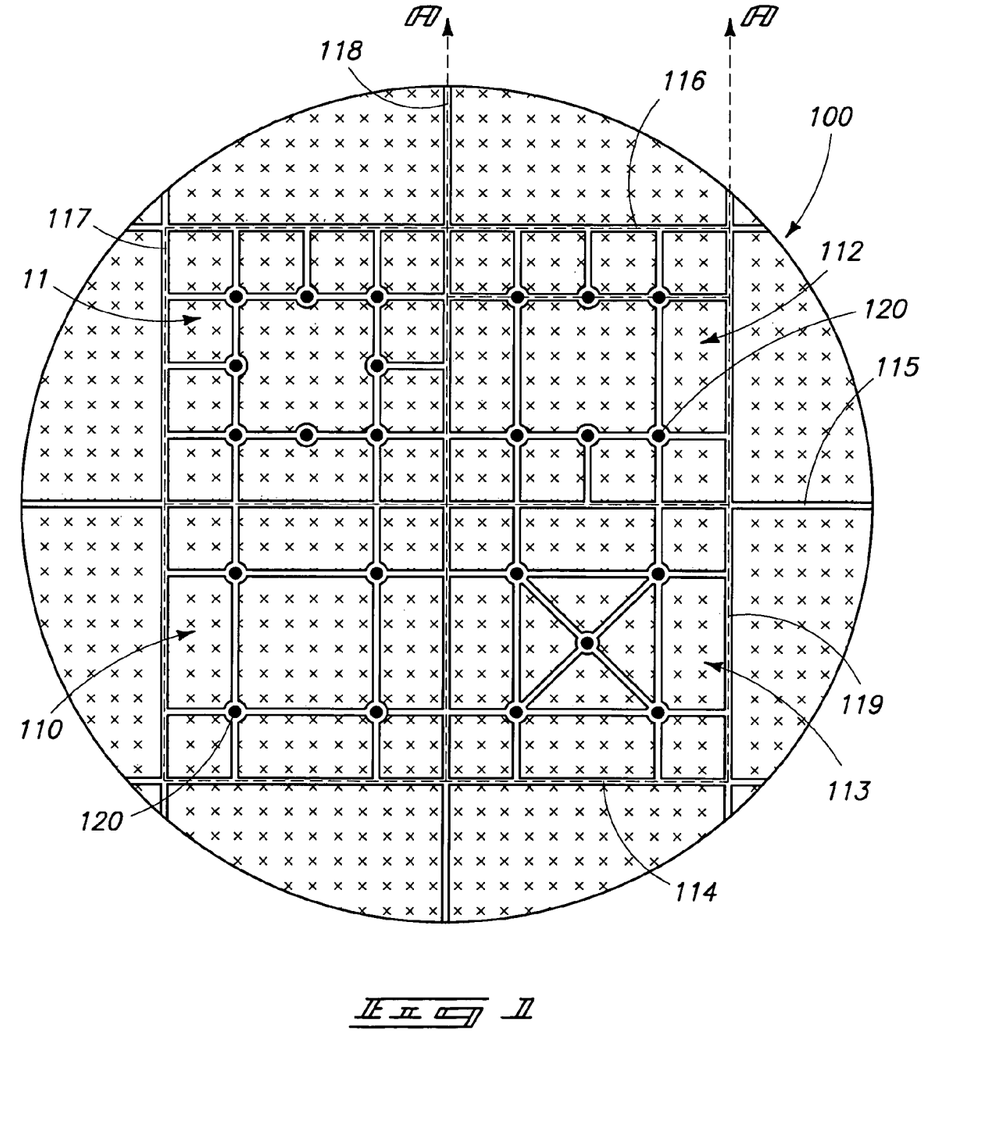
FIG. 1 is a top view of a wafer stack according to an embodiment of the invention.
Figure 2:
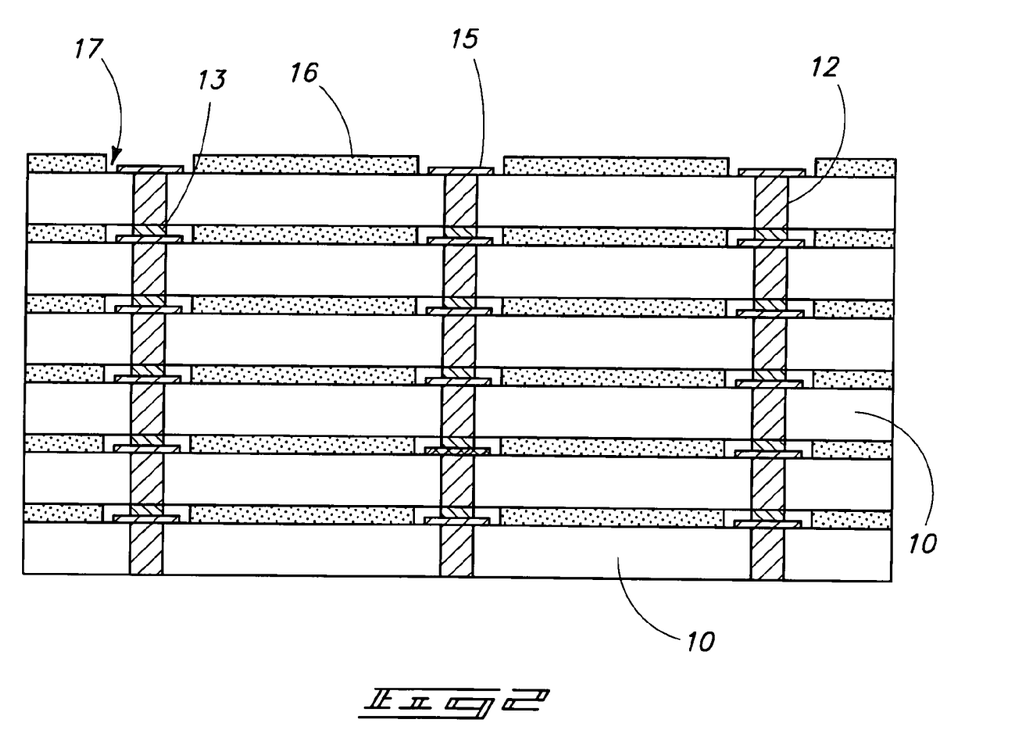
FIG. 2 is a cross-sectional view along line A-A in FIG. 1.

FIG. 1 shows an embodiment of the invention in the form of a circular wafer stack 100 which may be divided into four chips 110-113. FIG. 2 is a cross-sectional view along line A-A showing the structure of the wafer stack with a plurality of TSVs electrically connected by solder and with individual wafers bonded together by layers of adhesive that are patterned in a manner to be described below.

In this example each chip 110-113 has a different arrangement of vias 120 (e.g., a simple square in 110, two rows of three vias in 11 and 112, and a square with a central via in chip 113), but in each case every via is formed with a surrounding space that connects to an edge of the chip through channels either directly or through another surrounding space. It will be seen that the four chips are divided by mutually perpendicular main rows 114-119 that are channels formed by patterning the adhesive and which lead to the edge of the wafer.

Each channel in one of the chips 110-113 ultimately connects to one of the main rows 114-119 and thus to the edge of the wafer. It will also be understood that the main rows 114-119 result from a patterning of the adhesive layer such that the layer does not extend as a uniform layer over the entire wafer but is broken into islands of adhesive corresponding to the four chips and the surrounding parts of the wafer. By dividing the adhesive layer in this way stress may be relieved in the manufacturing process.

FIG. 2 shows the structure of the stacked wafers in more detail. In this example the wafer stack comprises six wafers 10 electrically interconnected by means of through-silicon-vias (TSVs) 12. The TSVs are electrically connected to each other by means of solder 13 located between the lower end of a TSV 12 and a metal pad 15 provided on the upper surface of a wafer 10 and covering the upper end of a TSV 12. The wafers 10 are physically bonded together by layers of adhesive 16.

Figure 3:
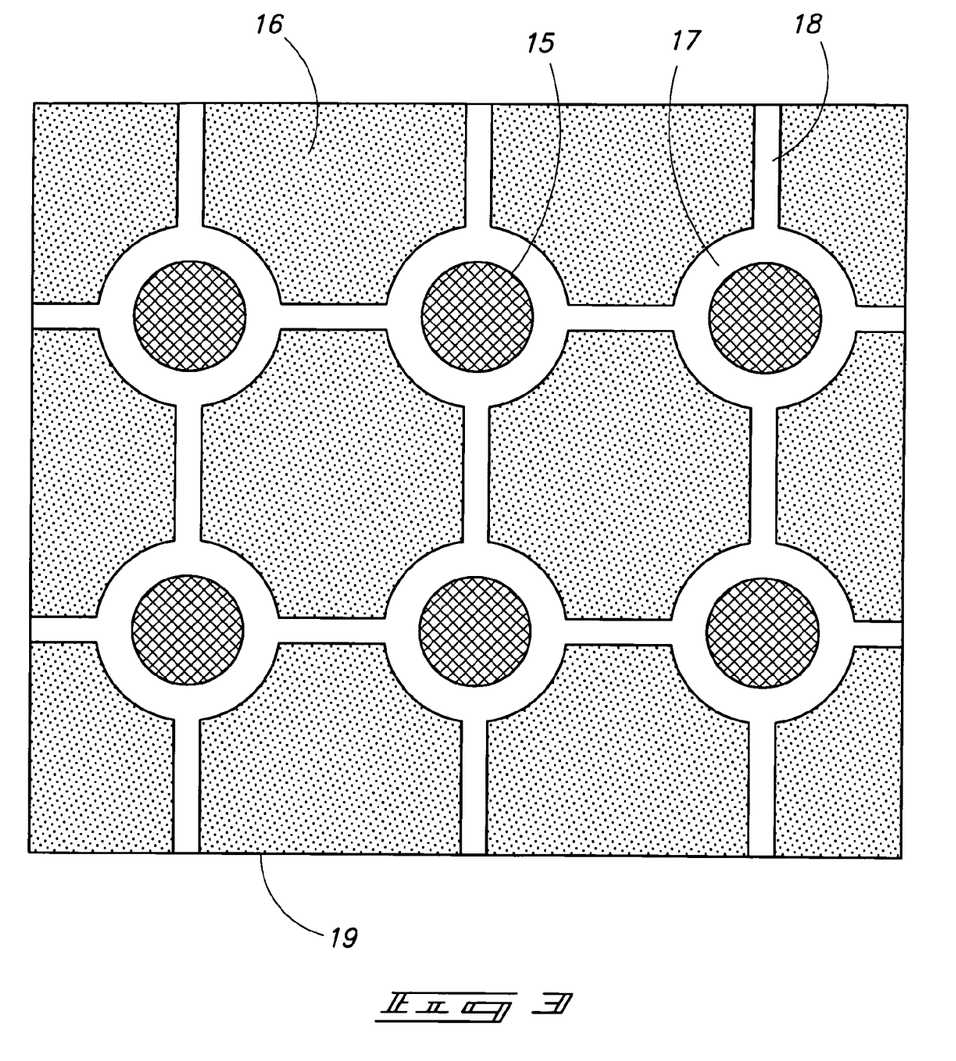
FIG. 3 is a cross-sectional view of a wafer illustrating the adhesive patterning.

FIG. 3, for clarity of understanding, shows a very simple example in which the TSVs 12 are arranged in a simple 2×3 array. As can be seen from FIG. 3 the adhesive 16 is patterned so as to leave an annular space 17 around each metal pad. Furthermore the adhesive 16 is also patterned so as to define interconnecting channels 18 that extend between each an annular space 17 such that each annular space 17 is connected to all adjacent annular spaces 17 by means of such interconnecting channels the purpose of which will be described later. It will also be noted that in addition to providing connections between the annular spaces 17, there is also an interconnecting channel 18 that leads from each annular space 17 to the edge 19 of the stack.

It should be noted, however, that FIG. 3 only shows a simple embodiment of the invention in which the TSVs are arranged in a simple regular 2×3 array in which each TSV has at least one interconnecting channel 18 that leads to an edge 19 (and in the case of the four corner TSVs there are two interconnecting channels 18 leading to two edges 19). In more complicated or larger structures there may be TSVs that are surrounded on all sides by other TSVs and may not connect directly to an edge but only to such other surrounding TSVs. Furthermore, while the example of FIG. 3 is a simple regular array in which the interconnecting channels are at right angles to each other and each annular space 17 connects to four interconnecting channels 18, in more complex patterns different numbers of channels 18 may be provided. Preferably, each TSV is provided with interconnecting channels 18 that connect a given TSV to all its immediately adjacent neighbours and—in the case of a TSV provided at an edge of the wafer—to the edge. Even this may not be essential, however. What is important is that a network of interconnecting channels are provided such that for every TSV, whether at an edge of the wafer or not, there exists a continuous path from the annular space 17 surrounding a TSV to an edge of the wafer 19, whether directly or via other annular spaces 17. It will also be understood that while in the embodiment shown in FIGS. 1-3 the spaces 17 surrounding each TSV 12 by the adhesive patterning are circular this is not essential and the spaces could take other possible shapes. It will be understood however that if no further wafers 10 are to be added to the stack no further adhesive layer 16 would be provided to the upper surface.

The following description will explain how such a structure may be manufactured.

Figure 4:
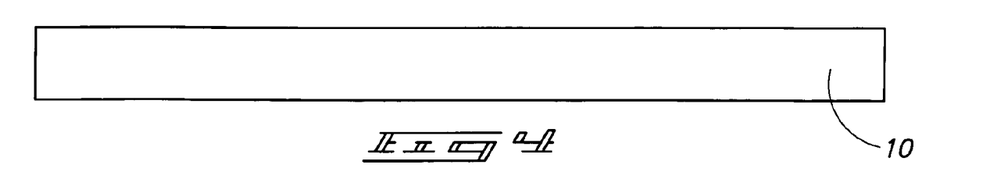
FIGS. 4 to 12 show a manufacturing process for creating a stacked wafer assembly as shown in FIGS. 1 and 2.
Figure 5:
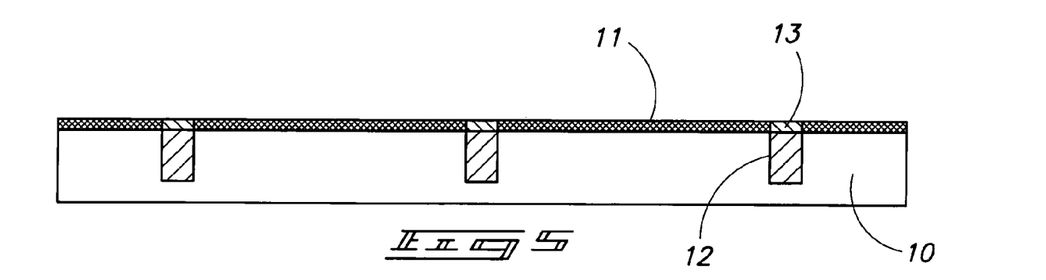
Figure 6:
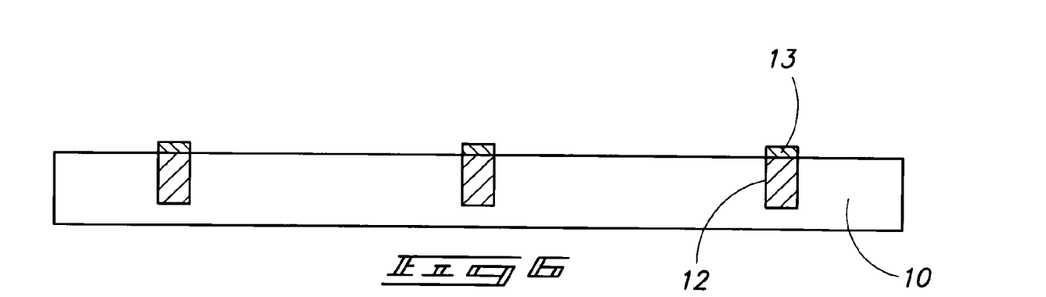
Figure 7:
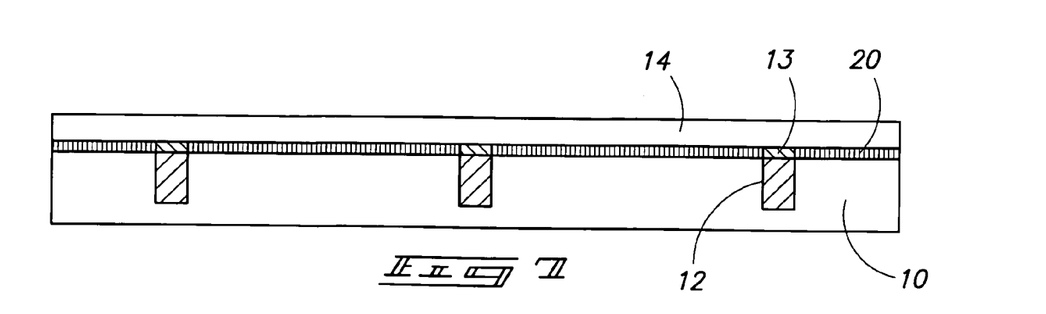
Figure 8:
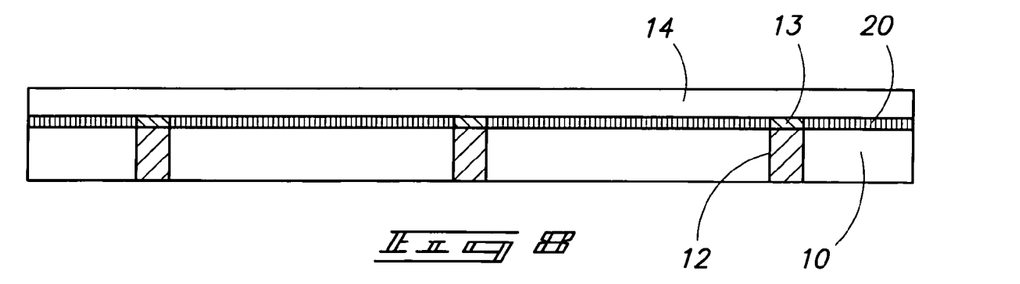

The starting point is a wafer 10 formed of a suitable material such as silicon (FIG. 4). A layer of photoresist 11 is then applied to the upper surface of the wafer 10 and patterned before a deep reactive-ion etching process is used to create vias 12. After the isolation layer (e.g., SiO2), adhesion layer (e.g., Ti/W) and seed layer (e.g., Cu) are prepared for the vias 12, they are then filled with metal, usually Cu or W or other suitable material by solder plating, and then a thin layer of solder is plated sequentially after finishing the filling metal plating (FIG. 5). It should be noted that at this stage the vias 12 do not extend through the complete depth of the wafer 10. The layer of photoresist 11 is then removed (FIG. 6) and the wafer 10 is then mounted on a wafer holder 14 through a layer of glue 20 (FIG. 7), and the wafer 10 is then subject to a thinning process (eg mechanical grinding, chemical-mechanical-polishing or chemical or plasma etching) until the inductive metal of the vias 12 extends all the way through the wafer 10 (FIG. 8).

Figure 9:
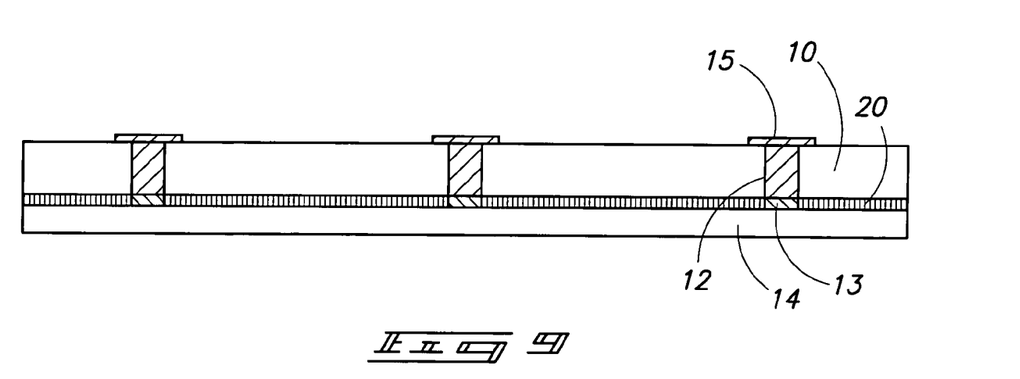
Figure 10:
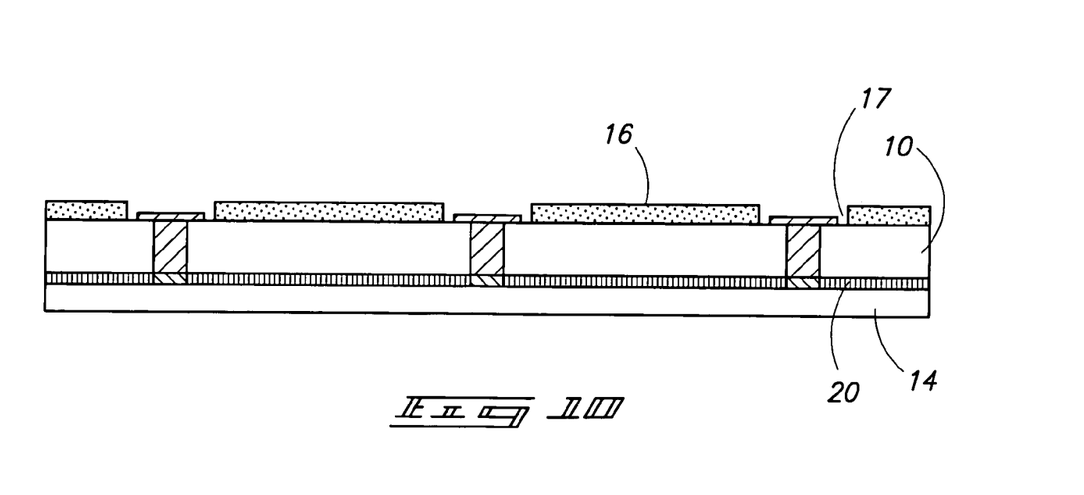

The wafer 10—still attached to the holder 14—is then inverted and metal pads 15 are then formed on the exposed ends of the vias 12 (FIG. 9) with a layer of insulator between the pad 15 and the wafer 10. An adhesive layer 16 is then applied to the exposed surface of the wafer 10 and is patterned as shown and described above with reference to FIGS. 1 to 3 such that an annular space 17 is defined around each metal pad 15. The patterning of the adhesive layer 16 will also include interconnecting channels 18 as shown in FIGS. 1 to 3 that interconnects the annular spaces 17 surrounding the metal pads 15 and which defines conduits connecting the annular spaces 17 to the edges of the wafer 10. The adhesive layer 16 is preferably a photosensitive polymer adhesive (e.g., SU-8) that can be patterned by exposure to light. It will of course be understand that the spaces 17 need not be annular and could be other shapes.

Figure 11:
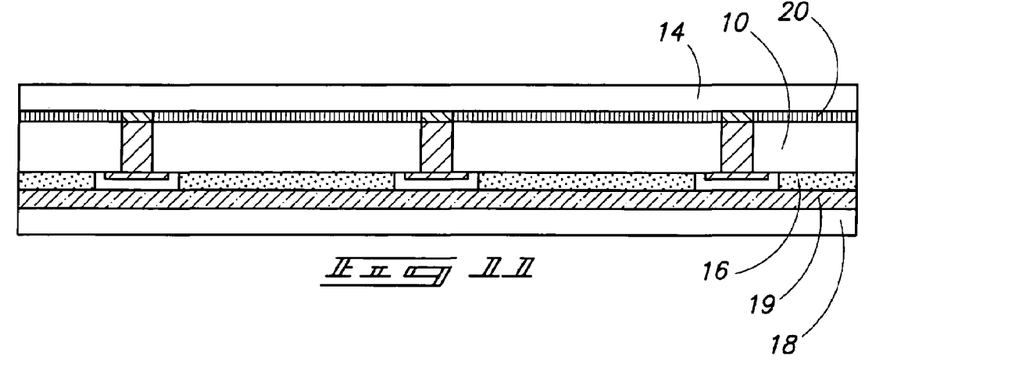
Figure 12:
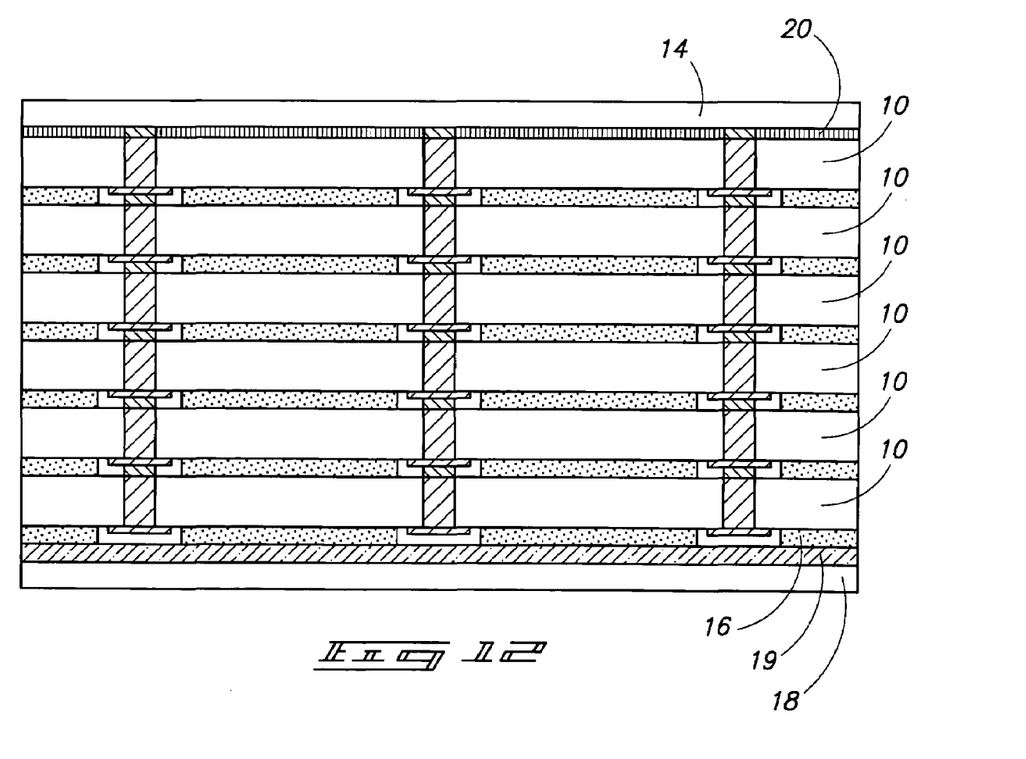

As shown in FIG. 11, the wafer holder 14 is then inverted and the wafer 10 is secured to a stiff substrate 18 through a layer of glue 19 with the patterned adhesive 16 contacting the glue layer 19. The wafer holder 14 is then removed and used again for the fabrication of the second wafer. Once the second wafer has been formed it is then secured to the first wafer 10 with the patterned adhesive layer 16 of the second wafer contacting the top surface of the first wafer. Once more the wafer holder 14 is removed and the process is repeated as often as required until the wafer stack is completed as shown in FIG. 12.

Following completion of the wafer stack assembly, the assembly is then subject to a single soldering process such that all solder portions are bonded to the respective metal pads. At the same time the soldering process also serves to act as a post-cure of the adhesive layers. Optionally the wafer stack assembly may be under loading compression during the soldering/post-cure process to enhance the bonding of the wafers by means of the adhesive layers. The use of a single soldering process avoids the problems caused by multiple reflow steps in the prior art.

It will be understood that the process described above is a hybrid solder bonding/adhesive bonding process. Solder bonding is used to provide good electrical connections between vias that can operate at high currents and with good reliability. The adhesive layer provides mechanical support for the layers while the stack is being assembled and easier wafer handling, and in the final wafer stack provides additional bonding strength. By patterning the adhesive layer channels are provided that enable gases released during outgassing to escape, and by dividing the adhesive layer into different regions stress can be relieved, while the symmetric sandwich structure (adhesive-silicon-adhesive) can balance the potential warpage caused by CTE mismatch.

Following the solder bonding process the wafer stack will be subject to a conventional singularity process and then underfill will be injected into the patterned adhesive layers and the wafer stack will be subject to a conventional molding process.

The invention claimed is:

1. A method of forming a wafer stack comprising the steps of: forming a plurality of wafers into a stack, each said wafer being provided with at least one through-silicon-via and with solder material being provided between through-silicon-vias formed in adjacent wafers, said wafers being bonded together by means of adhesive layers provided between adjacent wafers, and subjecting said stack to a single soldering process whereby said through silicon-vias are electrically interconnected by said solder material; and wherein said adhesive layers are patterned to define channels that extend from at least some of said through-silicon-vias to an edge of the stack.

2. A method as claimed in claim 1 wherein said adhesive is a photosensitive adhesive and is patterned by exposure to light.

3. A method as claimed in claim 1 wherein said adhesive layer is patterned to define a space surrounding each through-silicon-via formed in a wafer.

4. A method as claimed in claim 3 wherein said space is annular.

5. A method as claimed in claim 3 wherein at least two through-silicon-vias are formed in a wafer and the spaces surrounding said through-silicon-vias are interconnected by channels.

6. A method as claimed in claim 3 wherein said wafer is provided with a regular array of through-silicon-vias and wherein the space surrounding each said through-silicon-via is connected by channels to the spaces surrounding all adjacent through-silicon-vias.

7. A method as claimed in claim 3 wherein said adhesive layers are patterned to divide a wafer into a plurality of chips and wherein said chips in a wafer are divided by main channels formed in said adhesive layer and extending to at least one edge of the wafer, and wherein each said chip includes at least one through-silicon-via provided with a channel extending from the space surrounding said through-silicon-via to a said main channel.

8. A method as claimed in claim 1 wherein said stack is subject to compression loading during said soldering process.

9. A method as claimed in claim 1 wherein after the single soldering process the wafer is divided into individual chips which are then subject to an underfill and molding process.

10. A wafer stack comprising a plurality of wafers arranged in a stack, each said wafer including at least one through-silicon-via, wherein adjacent wafers are bonded together by means of an intervening adhesive layer, and wherein electrical connections between said wafers are formed by solder material provided between the through-silicon-vias formed in adjacent wafers; and wherein said adhesive layer is patterned to define channels that extend from at least some of said through silicon-vias to an edge of the stack assembly.

11. A wafer stack assembly as claimed in claim 10 wherein said adhesive layer is patterned to define a space surrounding each through-silicon-via formed in a wafer.

12. A wafer stack assembly as claimed in claim 11 wherein said space is annular.

13. A wafer stack assembly as claimed in claim 12 wherein at least two through silicon-vias are formed in a wafer and the spaces surrounding said through silicon-vias are interconnected by channels.

14. A wafer stack assembly as claimed in claim 13 wherein said wafer is provided with a regular array of through-siliconvias and wherein the space surrounding each said through-silicon-via is connected by channels to the spaces surrounding all adjacent through-silicon-vias.

15. A wafer stack assembly as claimed in claim 10 wherein said adhesive layers are patterned to divide each wafer into a plurality of chips and wherein said chips in a wafer are divided by main channels formed in a said adhesive layer and extending to at least one edge of the wafer, and wherein each said chip includes at least one through-silicon-via provided with a channel extending from the space surrounding said through-silicon-via to a said main channel.

* * * * *